(12) United States Patent
Gao

(10) Patent No.: US 12,013,193 B2
(45) Date of Patent: Jun. 18, 2024

(54) SECTIONAL ARCHITECTURE FOR FLUID MANAGEMENT AND LEAKAGE SENSORS

(71) Applicant: Baidu USA LLC, Sunnyvale, CA (US)

(72) Inventor: Tianyi Gao, Sunnyvale, CA (US)

(73) Assignee: BAIDU USA LLC, Sunnyvale, CA (US)

(*) Notice: Subject to any disclaimer, the term of this patent is extended or adjusted under 35 U.S.C. 154(b) by 429 days.

(21) Appl. No.: 17/340,842

(22) Filed: Jun. 7, 2021

(65) Prior Publication Data

US 2022/0390195 A1 Dec. 8, 2022

(51) Int. Cl.
*F28F 27/02* (2006.01)
*G01M 3/02* (2006.01)
*H05K 7/20* (2006.01)

(52) U.S. Cl.
CPC .............. *F28F 27/02* (2013.01); *G01M 3/02* (2013.01); *F28F 2265/16* (2013.01); *H05K 7/20272* (2013.01); *H05K 7/20281* (2013.01); *H05K 7/20781* (2013.01)

(58) Field of Classification Search
CPC ........ F28F 2265/16; F28F 27/02; G01M 3/02; H05K 7/20281; H05K 7/20781; H05K 7/20272

USPC ........................................................ 700/300
See application file for complete search history.

(56) References Cited

U.S. PATENT DOCUMENTS

| | | | | |
|---|---|---|---|---|
| 2007/0227710 | A1* | 10/2007 | Belady | H05K 7/2079 165/122 |
| 2016/0270259 | A1* | 9/2016 | Chainer | H05K 7/20272 |
| 2017/0105313 | A1* | 4/2017 | Shedd | H05K 7/20309 |
| 2017/0181321 | A1* | 6/2017 | Shelnutt | H05K 7/20836 |
| 2017/0181323 | A1* | 6/2017 | Shelnutt | H05K 7/20772 |
| 2017/0181329 | A1* | 6/2017 | Shelnutt | H05K 7/20781 |
| 2017/0245398 | A1* | 8/2017 | Hayashi | H05K 7/20809 |
| 2021/0084796 | A1* | 3/2021 | Gao | H05K 7/20818 |
| 2022/0046828 | A1* | 2/2022 | Miyamura | H05K 7/20818 |
| 2022/0174846 | A1* | 6/2022 | Heydari | H05K 7/20772 |
| 2022/0174847 | A1* | 6/2022 | Heydari | G06F 1/20 |

* cited by examiner

*Primary Examiner* — Chun Cao
(74) *Attorney, Agent, or Firm* — WOMBLE BOND DICKINSON (US) LLP (57) ABSTRACT

A liquid manifold can be assembled to an information technology (IT) rack to deliver and distribute fluid to IT equipment. The manifold can include a plurality of sections, each of the plurality of sections having one or more shut-off valves. One or more leak detection sensors can be arranged to detect leaks in any of the sections and in any of the IT equipment. A controller can control a shut-off valve to a closed position based on a detected leak. The design enables the manifold to better manage and control the fluid for mission critical IT equipment.

20 Claims, 6 Drawing Sheets

SECTIONAL ARCHITECTURE FOR FLUID MANAGEMENT AND LEAKAGE SENSORS

FIELD

Embodiments of the present disclosure relate generally to an information technology (IT) rack. In particular, the IT rack can have a sectional architecture for fluid management and leakage sensors.

BACKGROUND

Information Technology (IT) includes technology such as computers that are accessible through the internet or a local network, which provide storage of, or access to, data, websites, computer programs, algorithms, services, and more. IT equipment such as servers and other electronic devices (e.g., peripheral devices) can be installed in a chassis. These chassis can then be installed in an IT rack. An IT rack can be populated with a plurality of chassis as a manner of managing power and thermal requirements of the IT equipment.

A liquid cooling system transfers and delivers liquid between an IT rack and the chassis, and between the chassis and the IT equipment that is mounted on the chassis. Such a system can provide high operational and cooling efficiency of the IT equipment. Liquid cooling for high power density electronics has increased in popularity because air cooling can be thermally insufficient in some circumstances.

Liquid cooling systems can be susceptible to fluid leaks, which can damage IT equipment. When a leak is detected in an IT rack, the entire rack may be shutdown to reduce damage to the equipment, however, this can result in undesirable loss of capabilities and reduce reliability of a data center. In addition, cooling systems can lack flexibility in how components can be arranged or re-arranged in an IT rack. A permanent one-size fits all cooling solution makes it difficult to have different arrangements of IT equipment from rack to rack, and difficult to re-arrange the IT equipment in a rack. Thus, there is a need for a robust liquid cooling architecture that is resistant to leak failures and can provide flexible operation of IT equipment even when a leak is detected.

BRIEF DESCRIPTION OF THE DRAWINGS

The aspects are illustrated by way of example and not by way of limitation in the figures of the accompanying drawings in which like references indicate similar elements. It should be noted that references to "an" or "one" aspect of this disclosure are not necessarily to the same aspect, and they mean at least one. Also, in the interest of conciseness and reducing the total number of figures, a given figure may be used to illustrate the features of more than one aspect, and not all elements in the figure may be required for a given aspect.

DETAILED DESCRIPTION

Several aspects of the disclosure with reference to the appended drawings are now explained. Whenever the shapes, relative positions and other aspects of the parts described in a given aspect are not explicitly defined, the scope of the disclosure here is not limited only to the parts shown, which are meant merely for the purpose of illustration. Also, while numerous details are set forth, it is understood that some aspects may be practiced without these details. In other instances, well-known circuits, structures, and techniques have not been shown in detail so as not to obscure the understanding of this description. Furthermore, unless the meaning is clearly to the contrary, all ranges set forth herein are deemed to be inclusive of each range's endpoints.

Reference in the specification to "one embodiment" or "an embodiment" means that a particular feature, structure, or characteristic described in conjunction with the embodiment can be included in at least one embodiment of the disclosure. The appearances of the phrase "in one embodiment" in various places in the specification do not necessarily all refer to the same embodiment.

In some aspects of the present disclosure, a liquid cooling system for an IT rack is described. The liquid cooling system can have a liquid manifold that has a plurality of sections. Each section can have one or more shut-off valves that can cut off fluid to all IT equipment that receives fluid from that section. One or more leak detection sensors can be arranged to sense leaks in the manifold and/or in the IT equipment. A controller can receive a status of the one or more leak detection sensors. If a leak is detected, the controller can control a first of the one or more shut-off valves that is associated with the first of the one or more leak detection sensors, to a closed position. For example, if a leak is detected from a first of the IT equipment, or from a section of the manifold, the controller can control a first shut-off valve that is immediately upstream of the IT equipment and associated with that section, to an off position. Such a solution can provide a rack level design for implementing advanced liquid management and fluid control as well as leakage detect sensors.

Figure 1:
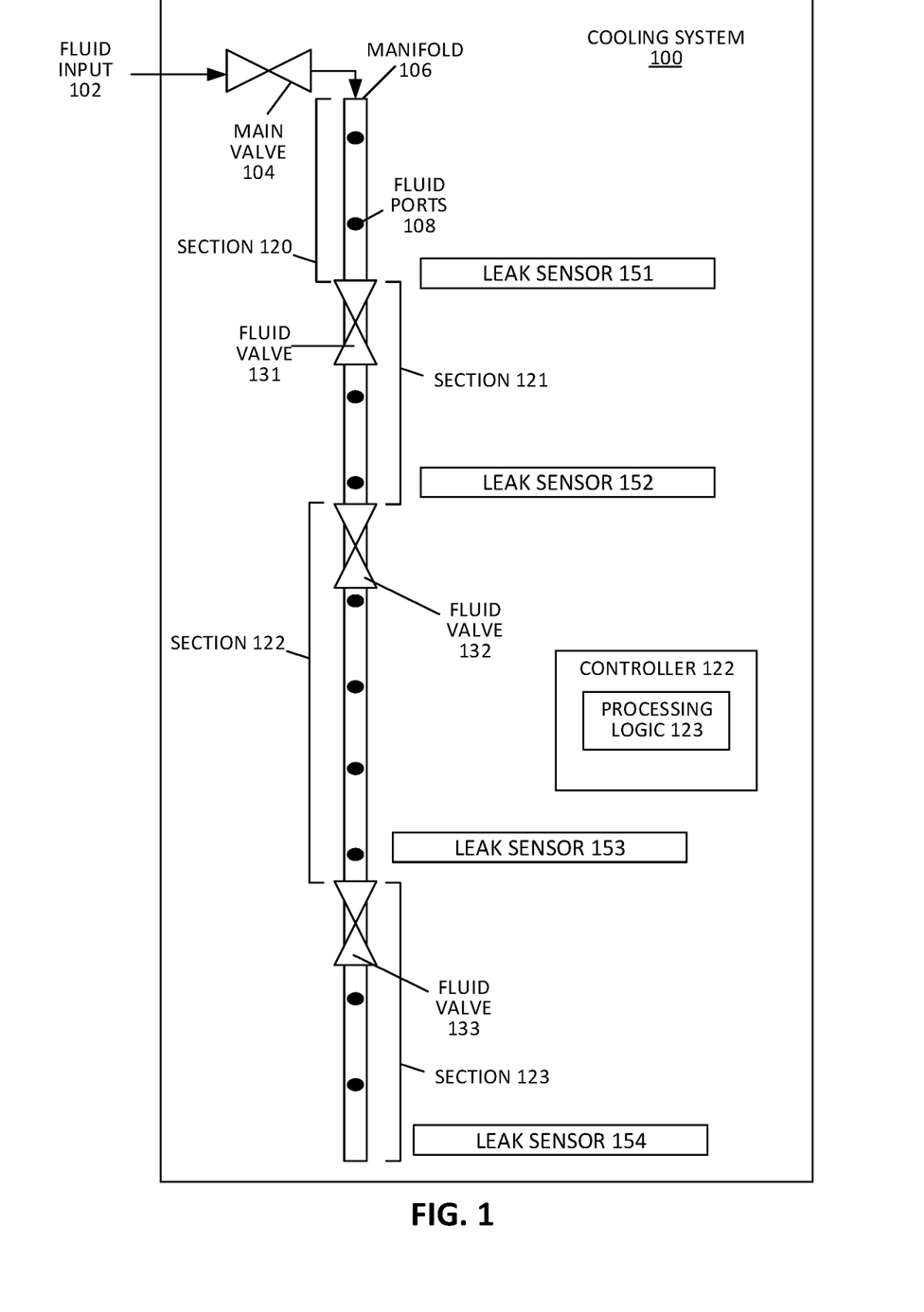
FIG. 1 shows a cooling system with sectional architecture, according to some embodiments.

FIG. 1 shows a cooling system 100 with sectional architecture, according to some embodiments. The cooling system can have a fluid input line 102, that can be connected to a fluid source to receive a fluid such as a liquid coolant (e.g., water, propylene glycol, etc.). A main valve 104 can be arranged in the path between the fluid input line and a liquid manifold 106. If the main valve is closed, then fluid is cut off to the entire manifold 201. If the main valve is open, then fluid can be delivered to the manifold from the fluid source.

The liquid manifold 106 can include a plurality of sections such as sections 120, 121, 122, and 123. A liquid manifold, such as liquid manifold 106, that supplies and distributes fluid to IT equipment, can be referred to as a supply manifold. A manifold that receives fluid from the IT equipment can be referred to as a return manifold. Each of the plurality of sections can have one or more shut-off valves. Each valve can control whether fluid is delivered or shut off to the corresponding section and downstream sections. For example, section 121 can have valve 131. If valve 131 is open, then fluid is delivered to section 121, as well as the sections downstream of section 121, such as section 122 and section 123. If valve 131 is closed, then section 121 will be cut-off from the fluid source, as well as the downstream sections 122 and 123. Section 122 also has a fluid valve 132, which can also be controlled to a closed position, and so on. It should be noted that although section 120 is not shown to have a valve in the body of the section, the main valve 104 can be treated by the controller as belonging to section 120. Thus, if a leak is present in the most upstream section, the main valve can be controlled to a closed position. In some embodiments, as shown in other figures, the most upstream section such as section 120 in this example, can also have a valve.

Each section can have one or more fluid ports 108. IT equipment can connect to each port to receive fluid from the respective section. Different sections can have the same or different number of ports. Similarly, sections can be uniform in length, or have varying lengths. The sections can form single flow path from the most upstream section to the most downstream section in a serial manner. The fluid ports can be understood as fluid connectors, such as manual mating dripless connectors or blind mating dripless connectors.

The cooling system can include one or more leak detection sensors 151, 152, 153, and 154. For example, the system can include at least one leak detection sensor that can be associated with a corresponding fluid valve 132. The leak detection sensors can include a nanoparticle sensor, a chemical sensor, a sensing band, and/or other equivalent sensing technology that senses a presence of a fluid. Additionally, or alternatively, the leak detection sensors can sense fluid flow or pressure at two or more positions to determine if there is a leak. Each leak detection sensor can be associated with the valve that is either immediately upstream from the leak that the leak detection sensor is monitoring. For example, each of the leak sensors 154 can be arranged on IT equipment that section 123 delivers fluid to, or arranged on section 123. Since there is no other fluid valve between fluid valve 133 and section 123, fluid valve 133 can be associated with each of the leak sensors 154. The association can also work in the other direction. For example, each valve can be associated with sensors that are arranged to detect a leak from the section immediately downstream of the valve. For example, one or more sensors 151 can be positioned to detect leaks from the manifold section 120, and/or IT equipment that receives fluid from section 120. Similarly, sensors 152 can be positioned to detect leaks in section 121 of the manifold, and/or leaks from IT equipment that receives fluid from section 121.

A controller 122 can receive status of the one or more leak detection sensors and, in response to a leak being detected by any of the one or more leak detection sensors, control one of the shut-off valves that is associated with the one or more leak detection sensors that detected the leak, to a closed position. The sensors can be hardwired to the controller, and/or communicate with the controller through wireless communications. The controller can access information that maps each of the sensors to each shut-off valve that is directly upstream of it. This information can be stored in a table or other data structure in computer-readable member. Thus, when the controller receives status that a leak is detected by sensors 152, the controller can control the fluid valve that is directly upstream (e.g., fluid valve 131) to the closed position. Other valves (e.g., the upstream valves) can be controlled to remain open. The fluid flows downstream from the fluid input through each section serially, so a closed up-stream valve cuts off fluid to all IT equipment that is downstream of the valve.

Operations, methods, and processes performed by the controller can be performed using processing logic 123. Processing logic can comprise hardware (e.g. circuitry, dedicated logic, etc.), software (e.g., embodied on a non-transitory computer readable medium), or a combination of both. Although the processes or methods are described above in terms of some sequential operations, it should be appreciated that some of the operations described may be performed in a different order. Moreover, some operations may be performed in parallel rather than sequentially.

Figure 2:
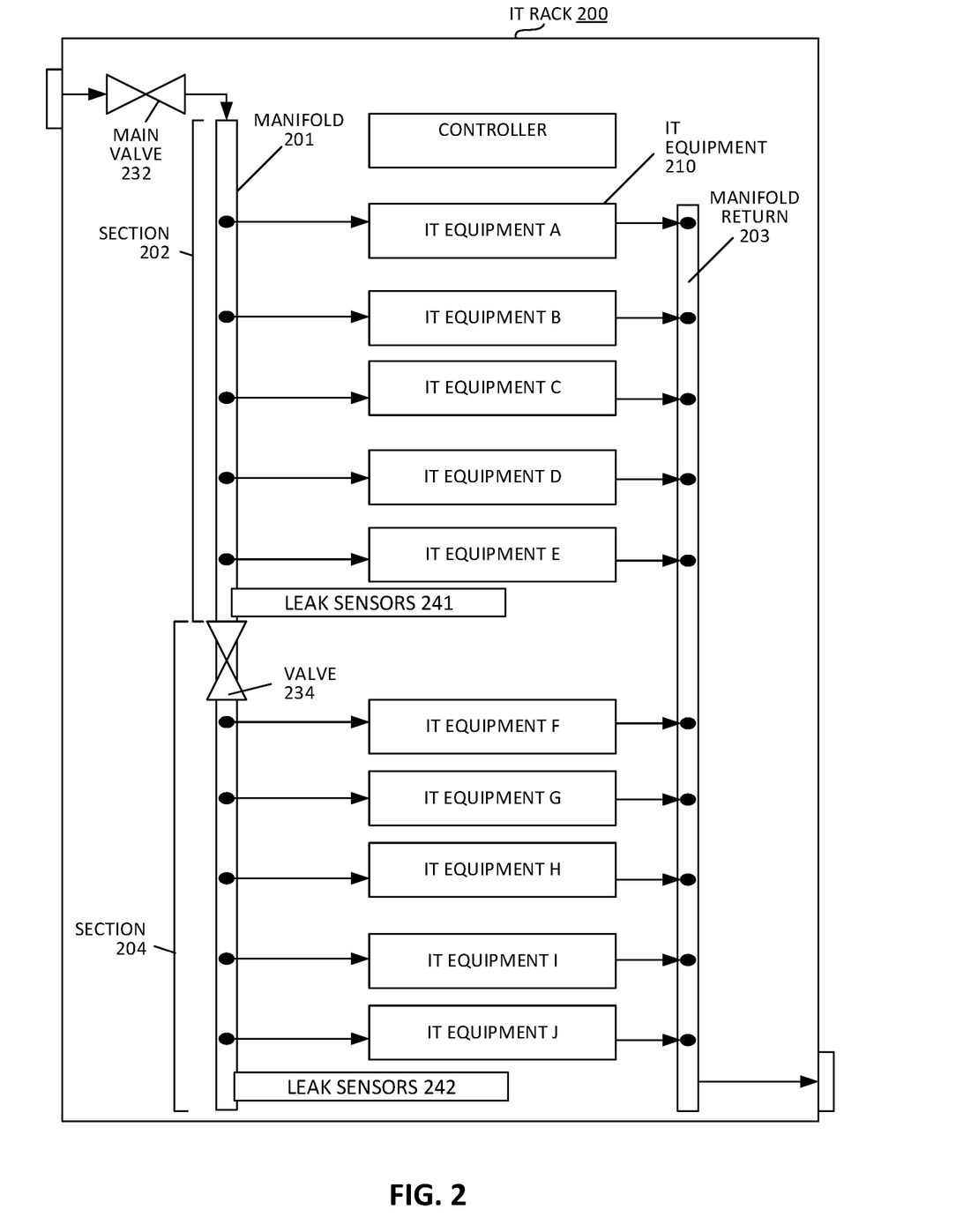
FIG. 2 shows an IT rack with cooling system, according to some embodiments.

FIG. 2 shows an IT rack 200 with cooling system, according to some embodiments. The cooling system can include features described in other sections of the disclosure. A manifold 201 can have a plurality of sections, such as, for example, sections 202 and 204. Each of the plurality of sections delivers cooling fluid to respective IT equipment 210 that are collectively stacked vertically on the IT rack. The IT equipment can have flexible or stiff conduits that attach to each of the ports to receive the cooling fluid. Section 202 can deliver fluid to IT equipment A, B, C, D, and E through respective fluid ports of section 202. The cooling fluid passes through the IT equipment thereby absorbing thermal energy from the IT equipment, and can exit the cooling system and IT rack through a manifold return 203. The fluid can be cooled by a facility cooling unit and system, such as a chiller, refrigeration, or other cooling techniques, and recirculated to the IT rack or other IT racks.

One or more leak detection sensors (241 and 242) can be arranged upon each of the plurality of sections and each of corresponding IT equipment, to detect whether any leak is present in any of the plurality of sections or any of the corresponding IT equipment. For example, one or more leak sensors 241 can be arranged strategically on, near, or below any or each of IT equipment A-E to determine whether any of IT equipment A-E have a fluid leak. Additionally, or alternatively, leak sensors 241 can be arranged strategically on, near, or below section 202 of the manifold, to detect a leak in this section of the manifold, or lines from the manifold to the IT equipment. The leak sensors can also be integrated with packaging of individual servers, the leak sensors can be understood as a set of sensors integrated with multiple servers.

Similarly, leak sensors 242 can be arranged on, near, and/or below any or each of IT equipment F-J to detect whether any of them are leaking. Additionally, or alternatively, leak sensors 242 can be arranged on, near, and/or below section 204 to detect presence of a fluid leak from section 204 of the manifold. In some aspects, the leak sensors 242 can be understood as sensors integrated within one or multiple sensors or cooling modules within the servers.

The IT equipment can be stacked one above the other as shown in the figure, in individual shelves in the IT rack 200. Thus, a leak from IT equipment A-E or section 202 of the manifold can travel down to IT equipment F-J and cause damage. However, a leak from Equipment F-J or section 204 is unlikely travel up to cause damage to IT equipment A-E, due to gravity. This gravitational framework can be leveraged to implement an order of importance among the IT equipment.

IT equipment having higher importance (e.g., running more critical workload, or requiring more critical service level agreement (SLA)) can be positioned above the IT equipment having lower importance, in the IT rack. For example, IT equipment A can perform critical operations. As such, IT equipment A may be grouped with other IT equipment (e.g., IT equipment B, C, D, and E) that receives fluid from manifold 201 which is the most upstream manifold in this example. IT equipment H, however, may be deemed as performing non-critical operations, thus, it is grouped with other IT equipment (F, H, I and J) that is deemed to be of lower importance.

This group (IT equipment F-J) receives fluid from section 204. If a leak is detected in one or more of the leak detection sensors 242 that are arranged downstream, then the controller can control shut-off valve 234, which is the immediately upstream valve, to the off position to reduce risk of damage to the IT equipment in that group (e.g., IT equipment F-J). Being that the IT equipment in this example is stacked vertically (e.g., relative to a gravitational force), the leak that is detected in sensors 242 poses a minimal risk to IT equipment A-E.

As such, the controller can control a first shut-off valve (e.g., valve 234) that is immediately upstream of the detected leak, to a closed position. A second shut-off valve that is upstream (e.g., main valve 232), can be controlled to be open in response to no leak being detected by the upstream leak detection sensors (e.g., leak detection sensors 241). The second shut-off valve (e.g., valve 232) controls flow to second IT equipment (e.g., IT equipment A-E) that is positioned above a first of the IT equipment (e.g., IT equipment F-J) that is arranged to receive fluid through the first shut-off valve (e.g., valve 234). More broadly, all of the valves other than the second shut-off valve, such as any of the valves that are upstream of the second shut-off valve, can be controlled to remain open.

The controller can manage shut-down of each of the IT equipment when a valve that is upstream of the IT equipment is closed. For example, if shut-off valve 234 is closed, then the controller can manage shut-down of IT equipment F-J by powering down the equipment. The controller can maintain IT equipment A-E as being powered. If the controller closes valve 232, however, then the controller can power down IT equipment A-E and IT equipment F-J.

In some embodiments, in response to a detected leak, the controller can also communicate to the first of the IT equipment (e.g., IT equipment F) and the second of the IT equipment (e.g., IT equipment E) to migrate one or more operations that are performed by the first of the IT equipment to the second of the IT equipment.

For example, if IT equipment F includes a server that performs movie streaming operations, then the controller can assign these movie streaming operations to be performed by IT equipment E, which can include making adjustments to software, settings, and/or firmware of IT equipment E. By migrating the operations in response to a leak, the controller can reduce the impact of the leak and improve reliability of the overall IT equipment.

The controller can communicate with each of the IT equipment, the valves, and the leak detection sensors, through one or more wired or wireless communication channels that can include network communication protocols (e.g., TCP/IP), analog I/O signals, digital I/O signals, and/or digital communication buses. Valves can have an actuator such as, for example, a spring-loaded solenoid that is normally open unless commanded closed by the controller, a servo-motor, or other controllable actuation mechanism.

Figure 3:
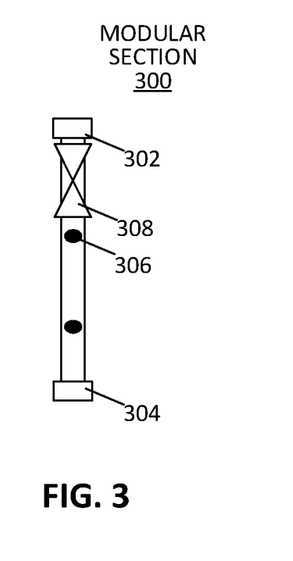
FIG. 3 shows a modular section of a manifold, according to some embodiments.

FIG. 3 shows a modular section 300 of a manifold, according to some embodiments. The modular section can include a first connector 302 at a first end of the section, and a second connector 304 at a second end. A fluid shut-off valve 308 can be arranged in the section upstream of each of the fluid ports 306. The fluid ports can be dripless quick disconnects. In some embodiments, the first connector and/or the second connector can include a blind-mate or quick-disconnect connector. A blind-mate connector and quick-disconnect connector can have tabs, clips, gaskets, springs, and/or other combinations of mechanisms that provides fora sliding, twisting, and/or snapping of mating connectors in a fluid-sealed connection. Such connectors provide improved maintainability and modularity—sections can be combined and removed manually without requiring tools (e.g., wrenches, welding, cutting, etc.).

Figure 4:
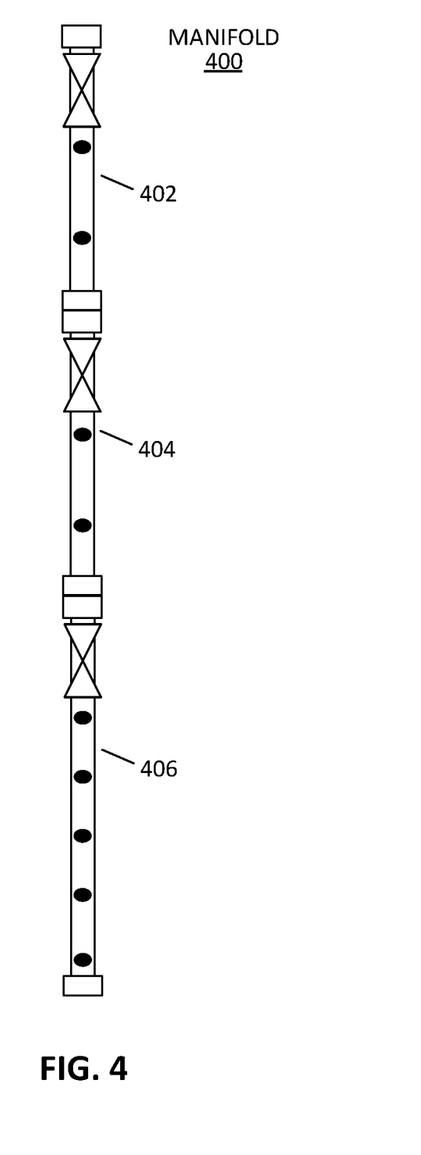
FIG. 4 shows a modular manifold, according to some embodiments.

FIG. 4 shows a modular manifold 400, according to some embodiments. The manifold can include a plurality of modular sections 402, 404, and 406. These modular sections can be those described with respect to other figures, such as FIG. 3, 5, or 6. Each of the sections can have a respective fluid shut-off valve positioned at an upstream end of the respective section and upstream of their respective fluid ports in that section. A downstream end of one section is connected to an upstream end of another section. As such, management of fluid cooling to IT equipment can be flexible. If the arrangement of IT equipment changes, or the criticality of IT equipment within a rack changes, the manifold can be changed accordingly with relative ease. It should be noted that some modular sections can have a different length or number of ports than other sections. For example, section 406 can be longer and have more ports than sections 402 and 404. Sections 402 and 404 can have the same length and number of ports. These sections be mixed and combined to suit a particular arrangement of IT equipment in an IT rack.

Figure 5:
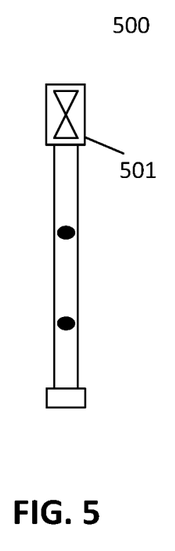
FIG. 5 and FIG. 6 show examples of a modular section of a manifold with integrated valve and connector, according to some embodiments.
Figure 6:
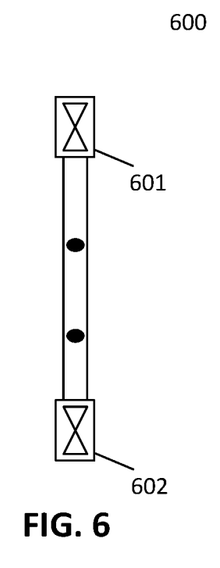

FIG. 5 and FIG. 6 show examples of a modular section of a manifold with integrated valve and connector, according to some embodiments. In FIG. 5, a modular section 500 is shown having a first connector 501, which is located at an upstream end of the modular section. This first connector can have a shut-off valve that is integrated or built into the connector. The design of modular section 500 is simplified, reducing the number of connectors and adapters to fit an in-line shut-off valve, thereby reducing possible points of failure. In some embodiments, as shown in FIG. 6, both of the end connectors 601 and 602 of a modular section 600 can have integrated built-in shut-off valves. With such a feature, installation of the modular sections is simplified—reducing the risk that such a modular section is installed with incorrect orientation.

Figure 7:
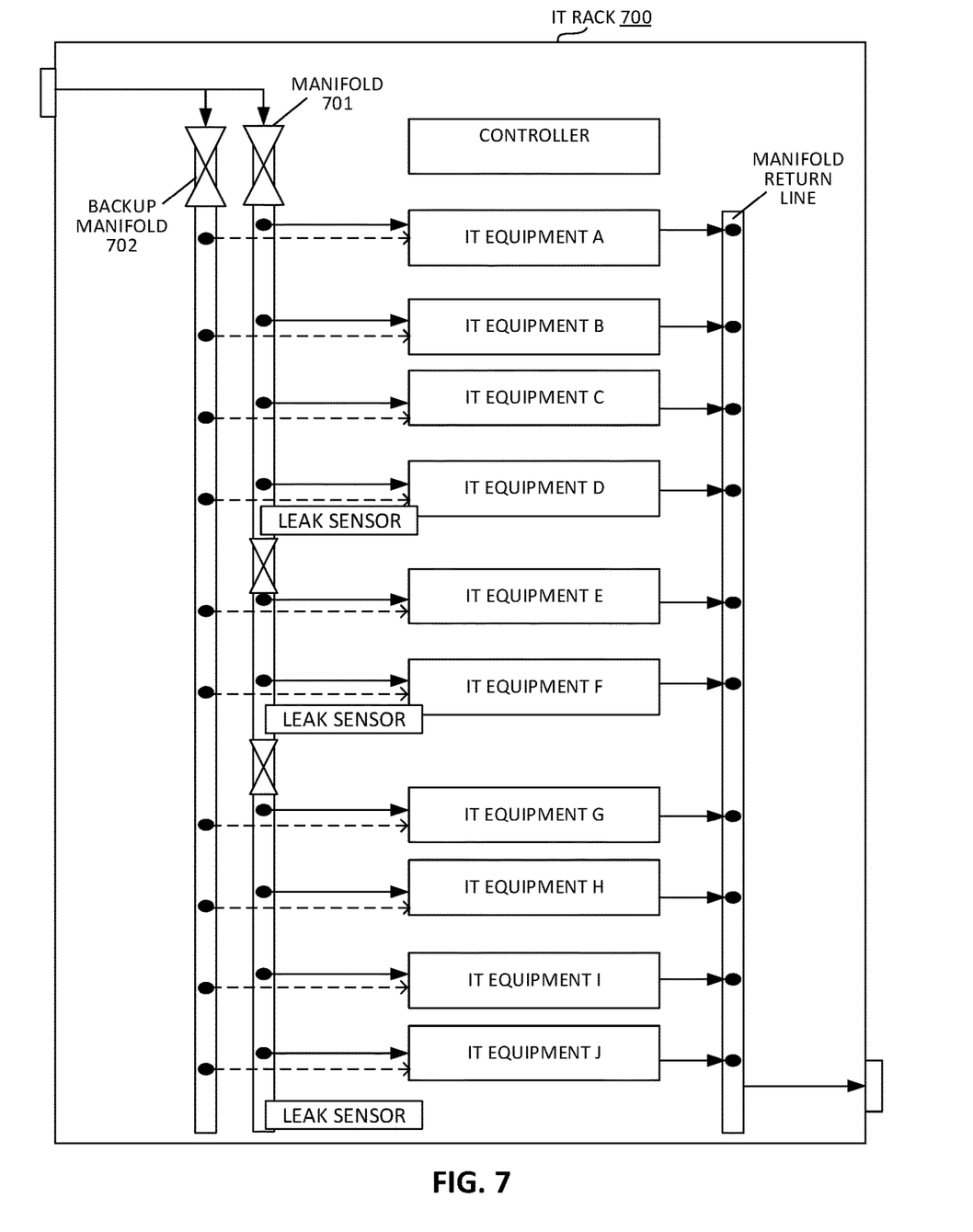
FIG. 7 shows an IT rack with cooling system that has redundant manifold, according to some embodiments.

FIG. 7 shows an IT rack 700 with cooling system that has redundant manifold, according to some embodiments. As discussed, a cooling system can include a manifold 701 that includes a plurality of sections that can cut-off fluid to IT equipment in some sections selectively, based on where a leak is detected. In some cases, if a section of the manifold 701 is detected to leak, then a controller can switch operation to a back-up manifold 702. As shown in this example, the backup manifold can have a single shut-off valve that is opened when a leak is detected in manifold 701. Given the relatively rare occurrence of a leak, the backup manifold can support the IT equipment with fluid until the manifold 701 or a leaky section of the manifold is repaired or replaced. In some embodiments, the backup manifold is used when the most-upstream valve of the primary manifold is shut-down. Otherwise, the primary manifold can be operated as discussed in other sections, with some upstream IT equipment being operational, while others are shut-down due to a detected leak. In some embodiments, backup manifold 702 covers other scenarios such as, for example, when a leakage occurs on the primary manifold 702. As such, if a leak sensor that is installed within a server detects a leak for that server, the backup manifold may not be activated because, in this case, the fluid supply to the servers need to be shutdown. For example, if the leak sensor within the IT equipment H is triggered, then the valve on the bottom of the primary manifold 701 can be shutdown. Backup manifold 702 would also remain inoperative (e.g., the fluid shutdown valve of the backup manifold remains in the closed position). IT Equipment G-J would be shutdown. Otherwise, IT equipment H would continue to leak if backup manifold 702 became operative. If, on the other hand, a sensor senses a leak from the manifold 701, but a leak is not sensed from IT equipment, then the controller can shut off manifold 701, and make backup manifold 702 operative. In this case, IT equipment G-J can remain operative.

In other embodiments, the back-up manifold 702 can be sectional (e.g., having one or more controllable downstream fluid-shut-off valves). The arrangement of the back-up manifold can be identical to the primary manifold in this case, so that if a section is found to be leaky, this section (and those downstream to it) can be cut-off. The back-up manifold can seamlessly direct fluid to those sections, without interrupting operation to the upstream equipment. As such, a second manifold such as back-up manifold 702 can be arranged to deliver cooling fluid to the IT equipment in the IT rack in response to a leak (e.g., one that is detected from the primary manifold).

Figure 8:
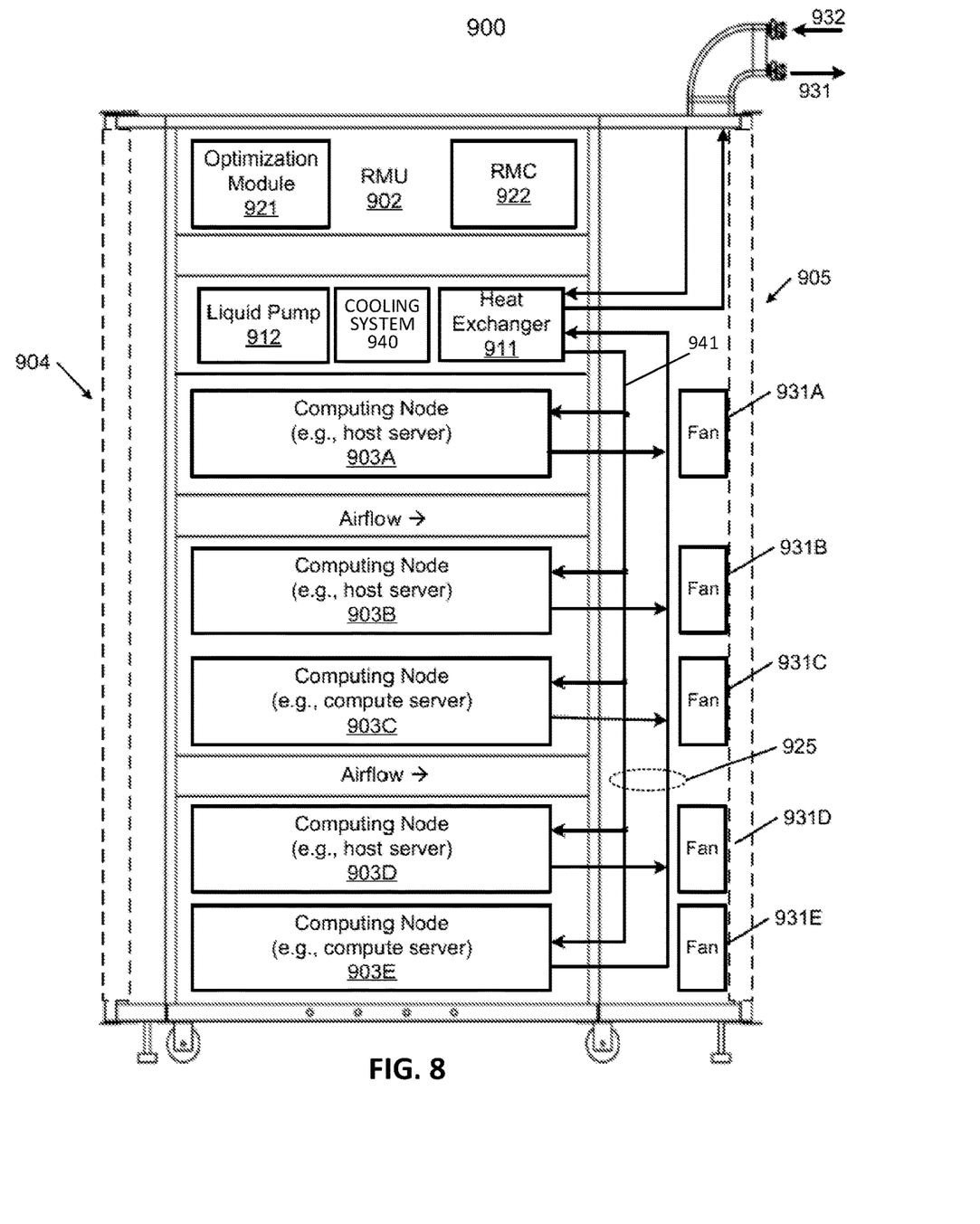
FIG. 8 is a block diagram illustrating an example of an IT rack having an integrated cooling system.

FIG. 8 shows an example of an IT rack and chassis with a sectional cooling system architecture, according to some embodiments, however, it should be understood that different variations can be implemented. IT rack 900 may contain one or more servers, each server having one or more processing units attached to a bottom of any of the cooling devices described above.

The rack 900 includes, but is not limited to, a cooling system 940, rack management unit (RMU) 902 (optional), and one or more server blades 903A-903D (collectively referred to as server blades 903). Cooling system 940 can be any embodiment of the cooling system described herein, and include a sectional delivery manifold 941 with sensors and shut-off valves distributed as-described.

Any of the server blades 903A-903E can be assembled as chassis with attached IT equipment (e.g., main PCB, peripheral devices, PCI-E devices, etc.), as described in other sections. The devices in the chassis are fluidly connected to the liquid system of the IT rack upon installation.

Server blades 903 can be inserted into an array of server slots respectively from frontend 904 or backend 905 of IT rack 900. Note that although there are only five server blades 903A-903E shown here, more or fewer server blades may be maintained within IT rack 900. Also note that the particular positions of cooling system 940, RMU 902, and server blades 903 are shown for the purpose of illustration only; other arrangements or configurations of may also be implemented. Note that rack 900 can be either open to the environment or partially contained by a rack container, as long as the cooling fans can generate airflows from the frontend to the backend.

In addition, for each of the server blades 903, a fan module is associated with the server blade. In this embodiment, fan modules 931A-931E, collectively referred to as fan modules 931, and are associated with server blades 903A-903E respectively. Each of the fan modules 931 includes one or more cooling fans. Fan modules 931 may be mounted on the backends of server blades 903 to generate airflows flowing from frontend 904, traveling through the airspace of the sever blades 903, and existing at backend 905 of rack 900.

A condenser of the cooling system 940 can be coupled to external liquid supply/return lines 931-932 to form a primary loop. In some embodiments, if the condenser is external to the IT rack, then the external fluid supply/return lines can connect to ports of the cooling system 940. The connectors coupled to the external liquid supply/return lines 931-932 may be disposed or mounted on backend 905 of the rack 900. In some embodiments, the liquid supply/return lines 931-932 are coupled to a set of room manifolds, which are coupled to an external heat removal system, or external cooling loop. The input and output channels of the cooling system can be coupled to liquid manifold 925 to form a secondary loop, which may include a supply manifold to supply cooling liquid to server blades 903 and a return manifold to return warmer liquid back to the cooling system 940.

Each of server blades 903 may include one or more IT components (e.g., central processing units or CPUs, graphical processing units (GPUs), memory, and/or storage devices). Each IT component may perform data processing tasks, where the IT component may include software installed in a storage device, loaded into the memory, and executed by one or more processors to perform the data processing tasks. At least some of these IT components may be attached to the bottom of any of the cooling devices as described above. Server blades 903 may include a host server (referred to as a host node) coupled to one or more compute servers (also referred to as computing nodes, such as CPU server and GPU server).

The host server (having one or more CPUs) typically interfaces with clients over a network (e.g., Internet) to receive a request fora particular service such as storage services (e.g., cloud-based storage services such as backup and/or restoration), executing an application to perform certain operations (e.g., image processing, deep data learning algorithms or modeling, etc., as a part of a software-as-a-service or SaaS platform). In response to the request, the host server distributes the tasks to one or more of the performance computing nodes or compute servers (having one or more GPUs) managed by the host server. The performance compute servers perform the actual tasks, which may generate heat during the operations.

IT rack 900 can further include optional RMU 902 configured to provide and manage power supplied to servers 903, fan modules 931, and cooling system 940. RMU 902 may be coupled to a power supply unit (not shown) to manage the power consumption of the power supply unit. The power supply unit may include the necessary circuitry (e.g., an alternating current (AC) to direct current (DC) or DC to DC power converter, backup battery, transformer, or regulator, etc.,) to provide power to the rest of the components of IT rack 900.

In one embodiment, RMU 902 includes optimization module 921 and rack management controller (RMC) 922. RMC 922 may include a monitor to monitor operating status of various components within rack 900, such as, for example, computing nodes 903, cooling system 940, and fan modules 931. Specifically, the monitor receives operating data from various sensors representing the operating environments of IT rack 900. For example, the monitor may receive operating data representing temperatures of the processors, cooling liquid, and airflows, which may be captured and collected via various temperature sensors. The monitor may also receive data representing the fan power and pump power generated by the fan modules 931 and liquid pump 912, which may be proportional to their respective speeds. These operating data are referred to as real-time operating data. Note that the monitor may be implemented as a separate module within RMU 902.

Based on the operating data, optimization module 921 performs an optimization using a predetermined optimization function or optimization model to derive a set of optimal fan speeds for fan modules 931 and an optimal pump speed for liquid pump 912, such that the total power consumption of liquid pump 912 and fan modules 931 reaches minimum, while the operating data associated with liquid pump 912 and cooling fans of fan modules 931 are within their respective designed specifications. Once the optimal pump speed and optimal fan speeds have been determined, RMC 922 configures liquid pump 912 and cooling fans of fan modules 931 based on the optimal pump speed and fan speeds.

As an example, based on the optimal pump speed, RMC 922 communicates with a pump controller of cooling system 940 to control the speed of liquid pump 912, which in turn controls a liquid flow rate of cooling liquid supplied to the liquid manifold 925 to be distributed to at least some of server blades 903. Therefore, the operating condition and the corresponding cooling device performance is adjusted. Similarly, based on the optimal fan speeds, RMC 922 communicates with each of the fan modules 931 to control the speed of each cooling fan of the fan modules 931, which in turn control the airflow rates of the fan modules 931. Note that each of fan modules 931 may be individually controlled with its specific optimal fan speed, and different fan modules and/or different cooling fans within the same fan module may have different optimal fan speeds.

Note that some or all of the IT components of servers 903 may be attached to any one of the cooling devices described above, either via air cooling using a heatsink or via liquid cooling using a cold plate. One server may utilize air cooling while another server may utilize liquid cooling. Alternatively, one IT component of a server may utilize air cooling while another IT component of the same server may utilize liquid cooling. Liquid cooled IT equipment can have one or more cold plates attached to electronic components of the IT equipment, thereby transferring thermal energy between the IT equipment and the fluid.

It should be understood that some features described and shown in the drawings can vary without departing from the scope of the disclosure. Further, additional valve or auxiliary units can be added to the cooling system for additional features. Further, different types of valves, e.g., three way valves, can be implemented in the cooling system to achieve the same results. In some embodiments, the controller may adjust opening ratios between completely closed (0%) and completely open (100%) of any of the valves as described herein.

Some embodiments may include a non-transitory machine-readable medium (such as microelectronic memory) having stored thereon instructions, which program one or more data processing components (generically referred to here as a "processor") to perform operations described herein. In some embodiments, some of these operations might be performed by specific hardware components that contain hardwired logic. Those operations might alternatively be performed by any combination of programmed data processing components and fixed hardwired circuit components.

In the foregoing specification, embodiments of the disclosure have been described with reference to specific exemplary embodiments thereof. It will be evident that various modifications may be made thereto without departing from the broader spirit and scope of the disclosure as set forth in the following claims. The specification and drawings are, accordingly, to be regarded in an illustrative sense rather than a restrictive sense.

While certain aspects have been described and shown in the accompanying drawings, it into be understood that such aspects are merely illustrative of and not restrictive on the broad disclosure, and that the disclosure is not limited to the specific constructions and arrangements shown and described, since various other modifications may occur to those of ordinary skill in the art. The description is thus to be regarded as illustrative instead of limiting.

In some aspects, this disclosure may include the language, for example, "at least one of [element A] and [element B]." This language may refer to one or more of the elements. For example, "at least one of A and B" may refer to "A," "B," or "A and B." Specifically, "at least one of A and B" may refer to "at least one of A and at least one of B," or "at least of either A or B." In some aspects, this disclosure may include the language, for example, "[element A], [element B], and/or [element C]." This language may refer to either of the elements or any combination thereof. For instance, "A, B, and/or C" may refer to "A," "B," "C," "A and B," "A and C," "B and C," or "A, B, and C."

What is claimed is:

1. A liquid cooling system for an IT rack, comprising:
   a liquid manifold connected to an external fluid supply comprising a plurality of sections, wherein each of the plurality of sections has one or more shut-off valves, each of the plurality of sections is upstream or downstream of another one of the plurality of sections, and shut-off of one of the one or more shut-off valves in an upstream one of the plurality of sections blocks cooling fluid to a downstream one of the plurality of sections;
   one or more leak detection sensors;
   a controller with one or more processors, configured to:
   receive a status of the one or more leak detection sensors; and
   in response to a leak being detected by a first of the one or more leak detection sensors, control a first of the one or more shut-off valves that is associated with the first of the one or more leak detection sensors, to a closed position.

2. The liquid cooling system of claim 1, wherein each of the plurality of sections delivers the cooling fluid to respective IT equipment that are collectively stacked vertically on the IT rack.

3. The liquid cooling system of claim 2, wherein the IT equipment having higher importance is positioned above the IT equipment having lower importance, in the IT rack.

4. The liquid cooling system of claim 3, wherein the processor is configured to control a second of the one or more shut-off valves that is arranged to control flow to second IT equipment to be open when no leak is detected by a second of the one or more leak detection sensors, the second IT equipment being positioned above a first of the IT equipment that is cut off from receiving fluid through the first of the one or more shut-off valves that is in the closed position.

5. The liquid cooling system of claim 4, wherein the processor is further configure to, in response to the leak, communicate to the first of the IT equipment and the second of the IT equipment to migrate one or more performed by the first of the IT equipment to the second of the IT equipment.

6. The liquid cooling system of claim 1, wherein each of the plurality of sections includes a first connector at a first end, and a second connector at a second end, the first connector and the second connector being blind-mate or quick-disconnect connectors.

7. The liquid cooling system of claim 6, wherein at least one of the first connector and the second connector includes a corresponding one of the one or more shut-off valves.

8. The liquid cooling system of claim 7, wherein both of the first connector and the second connector includes a corresponding one of the one or more shut-off valves.

9. The liquid cooling system of claim 1, wherein the one or more leak detection sensors are arranged upon each of the plurality of sections and each of corresponding IT equipment, to detect whether any leak is present in any of the plurality of sections or any of the corresponding IT equipment.

10. The liquid cooling system of claim 1, further comprising a second manifold that is arranged to deliver the cooling fluid to IT equipment in the IT rack in response to the leak.

11. An information technology (IT) rack, comprising:
a liquid manifold connected to an external fluid supply comprising a plurality of sections, wherein each of the plurality of sections has one or more shut-off valves, each of the plurality of sections is upstream or downstream of another one of the plurality of sections, and shut-off of one of the one or more shut-off valves in an upstream one of the plurality of sections blocks cooling fluid to a downstream one of the plurality of sections;
one or more leak detection sensors;
a controller with one or more processors, configured to:
receive a status of the one or more leak detection sensors; and
in response to a leak being detected by a first of the one or more leak detection sensors, control a first of the one or more shut-off valves that is associated with the first of the one or more leak detection sensors, to a closed position.

12. The IT rack of claim 11, wherein each of the plurality of sections delivers the cooling fluid to corresponding IT equipment that are collectively stacked vertically on the IT rack.

13. The IT rack of claim 12, wherein the IT equipment having higher importance is positioned above the IT equipment having lower importance, in the IT rack.

14. The IT rack of claim 13, wherein the processor is configured to control a second of the one or more shut-off valves that is arranged to control flow to second IT equipment to be open when no leak is detected by a second of the one or more leak detection sensors, the second IT equipment being positioned above a first of the IT equipment that is cut off from receiving fluid through the first of the one or more shut-off valves that is in the closed position.

15. The IT rack of claim 14, wherein the processor is further configure to, in response to the leak, communicate to the first of the IT equipment and the second of the IT equipment to migrate one or more performed by the first of the IT equipment to the second of the IT equipment.

16. The IT rack of claim 11, wherein each of the plurality of sections includes a first connector at a first end, and a second connector at a second end, the first connector and the second connector being blind-mate or quick-disconnect connectors.

17. The IT rack of claim 16, wherein at least one of the first connector and the second connector includes a corresponding one of the one or more shut-off valves.

18. The IT rack of claim 17, wherein both of the first connector and the second connector includes a corresponding one of the one or more shut-off valves.

19. The IT rack of claim 11, wherein the one or more leak detection sensors are arranged upon each of the plurality of sections and each of corresponding IT equipment, to detect whether any leak is present in any of the plurality of sections or any of the corresponding IT equipment.

20. The IT rack of claim 11, further comprising a second manifold that is arranged to deliver the cooling fluid to IT equipment in the IT rack in response to the leak.

* * * * *